United States Patent
Cooper

(10) Patent No.: US 10,402,366 B2
(45) Date of Patent: Sep. 3, 2019

(54) EFFICIENT AND SCALABLE MULTI-VALUE PROCESSOR AND SUPPORTING CIRCUITS

(76) Inventor: Benjamin J. Cooper, Bloomington, CA (US)

(*) Notice: Subject to any disclaimer, the term of this patent is extended or adjusted under 35 U.S.C. 154(b) by 818 days.

(21) Appl. No.: 13/280,662

(22) Filed: Oct. 25, 2011

(65) Prior Publication Data

US 2012/0216013 A1    Aug. 23, 2012
US 2018/0357203 A9    Dec. 13, 2018

Related U.S. Application Data

(63) Continuation-in-part of application No. 11/852,544, filed on Sep. 10, 2007, now Pat. No. 8,237,466, which is a continuation-in-part of application No. 11/465,853, filed on Aug. 21, 2006, now Pat. No. 8,593,875.

(60) Provisional application No. 61/406,203, filed on Oct. 25, 2010.

(51) Int. Cl.
*G11C 11/34* (2006.01)
*G06F 15/80* (2006.01)
*G06F 7/49* (2006.01)

(52) U.S. Cl.
CPC ............ *G06F 15/8007* (2013.01); *G06F 7/49* (2013.01); *G11C 11/34* (2013.01)

(58) Field of Classification Search
CPC .. G11C 11/34; G11C 8/08; G11C 8/10; G06F 7/49; G06F 15/8007

USPC ...................................... 365/230.06
See application file for complete search history.

(56) References Cited

U.S. PATENT DOCUMENTS

| | | | | |
|---|---|---|---|---|
| 5,500,609 A | * | 3/1996 | Kean | G06F 17/5054 326/41 |
| 5,808,932 A | * | 9/1998 | Irrinki | G11C 11/565 365/150 |
| 5,867,423 A | * | 2/1999 | Kapoor | G11C 11/5692 365/168 |
| 8,513,975 B2 | * | 8/2013 | Cooper | G06F 7/49 326/59 |
| 8,593,875 B2 | * | 11/2013 | Cooper | G06F 7/49 326/59 |
| 2008/0147769 A1 | * | 6/2008 | Cooper | G06F 7/49 708/493 |

* cited by examiner

Primary Examiner — Gene N Auduong

(57) ABSTRACT

Briefly, an efficient and scalable processor device is disclosed that uses multi-value voltages for operands, results, and signaling. An array of cells is arranged in rows and columns, and one or more multi-value operands are used to select a cell from the array. A row driver may be used to select a row of cells, and a column driver is used to select a particular column from the selected row. Once a particular cell is selected, a voltage value associated with that cell is passed as an output, which is typically a multi-value result. The multi-value processor is constructed such that the row driver and column driver can be substantially identical, and have a structure that enables significant circuit reuse, provides substantial reduction in size for a circuit layout, has increased layout symmetry, simple scalability, and advantageous power conservation.

24 Claims, 15 Drawing Sheets

280

| | | OPERAND VALUE | | | |
|---|---|---|---|---|---|
| | | 0 | 1 | 2 | 3 | |
| REF 0 | (top trans.) | PASS | Block | Block | Block | ROW 0 |
| | (bot. trans.) | PASS | Block | Block | Block | SELECT |
| DAT 0 | (top trans.) | Block | PASS | Pass | Pass | ROW 1 |
| REF 1 | (bot. trans.) | Pass | PASS | Block | Block | SELECT |
| DAT 1 | (top trans.) | Block | Block | PASS | Pass | ROW 2 |
| REF 2 | (bot. trans.) | Pass | Pass | PASS | Block | SELECT |
| DAT 2 | (top trans.) | Block | Block | Block | PASS | ROW 3 |
| | (bot. trans.) | Block | Block | Block | PASS | SELECT |

FIG. 12

| Operand Data Value | 0 | 1 | 2 | 3 |
|---|---|---|---|---|
| Driver output from sense amp 0 | | | | |
| REF 0 | hi | lo | lo | lo |
| DAT 0 | lo | hi | hi | hi |
| Driver output from sense amp 1 | | | | |
| REF 1 | hi | hi | lo | lo |
| DAT 1 | lo | lo | hi | hi |
| Driver output from sense amp 2 | | | | |
| REF 2 | hi | hi | hi | lo |
| DAT 2 | lo | lo | lo | hi |
| Row or Column | 0 | 1 | 2 | 3 |

FIG. 13

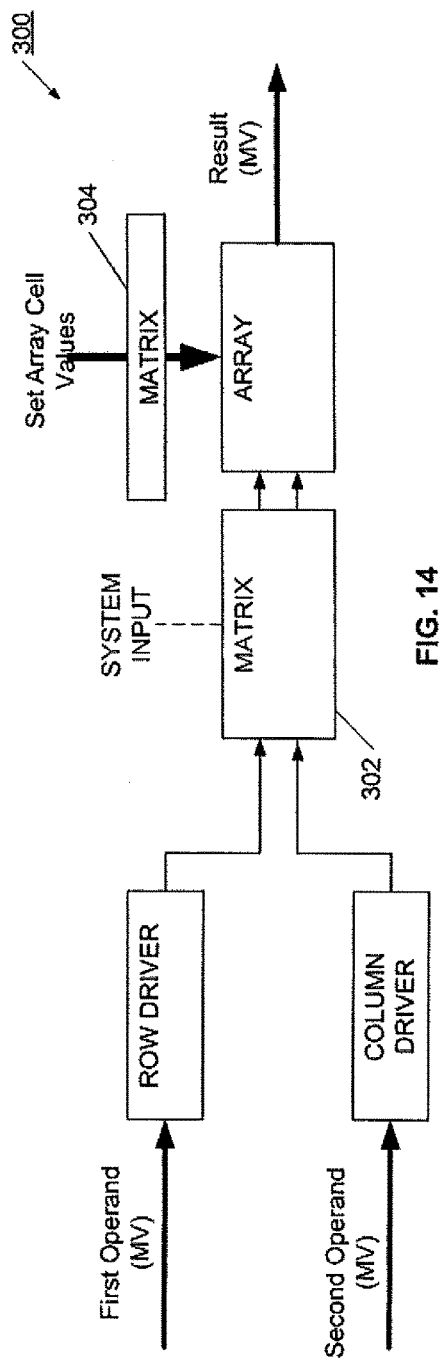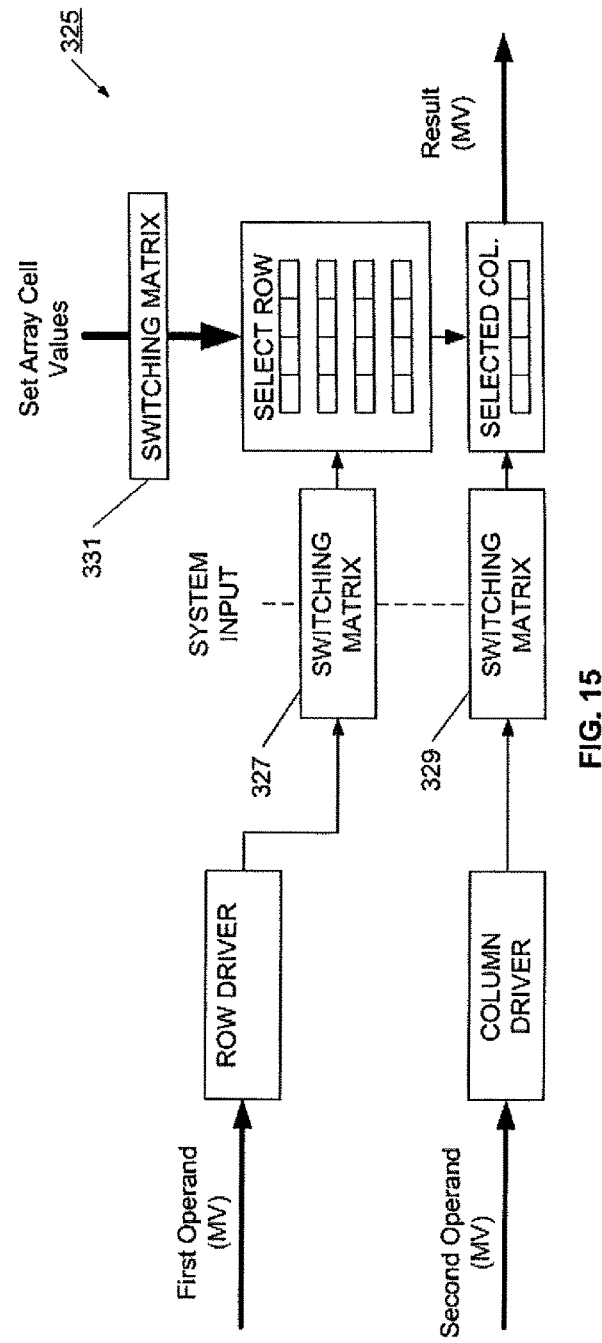

US 10,402,366 B2

EFFICIENT AND SCALABLE MULTI-VALUE PROCESSOR AND SUPPORTING CIRCUITS

RELATED APPLICATIONS

This application claims priority to provisional U.S. application No. 61/406,203, filed Oct. 25, 2010, and entitled "Efficient and Scalable Multi-Value Processor and Supporting Circuits;" this application is a continuation-in-part to U.S. patent application Ser. No. 11/852,544, filed Sep. 10, 2007 and entitled "Device and Method for Enabling Multi-Value Digital Computation and Control," which issued as U.S. Pat. No. 8,237,466 on Aug. 7, 2012, which is a continuation-in-part to U.S. patent application Ser. No. 11/465,853, filed Aug. 21, 2006 and entitled "Device and Method for Enabling MultiValue Digital Computation," which issued as U.S. Pat. No. 8,593,875 on Nov. 26, 2013.

FIELD OF THE INVENTION

The present invention relates to circuits and processes for multi-value computation. More particularly, the invention relates to circuits and processes that enable more efficient, more complex, and more efficient computation.

BACKGROUND

Computers are used to enhance many aspects of everyday life. Computers are used in many products to augment functionality and provide users with improved service. For example, computers in cars can help monitor the maintenance necessary to maintain the vehicle in proper driving condition, help direct drivers to their destinations, and perform many other functions to enhance the user experience.

The ability of a computer to improve the experience of users is limited by the functional capacity of the computer. The functional capacity of computers is dependent on their circuitry. Traditionally, increasing functional capacity of binary circuits has been accomplished by means such as reducing the size of circuit components, adding more components to the circuit, and increasing clock speeds to hasten the computation process. The cost of increasing the functionality of circuits in these ways is significant and trade-offs must be made between cost and performance. In addition, increasing the amount of circuitry generally increases the power consumption. Particularly in applications where power and space are limited, increasing the functionality of computers is a difficult problem.

Non-binary, that is, using more than two voltage states to represent values in computation, may provide an alternative means to improve the functionality of computers at a lower price than traditional means of improving binary circuitry. However, traditional implementations of multi-value digital circuitry have suffered from issues such as excessive power consumption, excessive size, and lack of functionality comparable to binary circuits. Improved multi-value computation could provide an inexpensive means to improve the functionality of computers and enhance the experience of consumers who use them.

SUMMARY

An efficient and scalable processor device is disclosed that uses multi-value voltages for operands, results, and signaling. The number of values used in the multi-value system may be defined for a particular processor system, which typically may be 4, 8, 16, 32, for example. In one example of the multi-value processor, an array of cells is arranged in rows and columns, and one or more multi-value operands are used to select a cell from the array. More particularly, a row driver may be used to select a row of cells, and a column driver is used to select a particular column from the selected row. Once a particular cell is selected; a voltage value associated with that cell is passed as an output. The output is also typically a multi-value result. The multi-value processor is constructed such that the row driver and column driver may be substantially identical, and have a structure that enables significant circuit reuse, provides substantial reduction in size for a circuit layout, has increased layout symmetry, simple scalability, and advantageous power conservation.

BRIEF DESCRIPTION OF THE DRAWINGS

FIG. 12 is a truth table of driver line values for use in a multi-value processor in accordance with the present invention.

FIG. 13 is a truth table of driver line values for use in a multi-value processor in accordance with the present invention.

FIG. 14 is a block diagram of a basic multi-value processor with a switching function in accordance with the present invention.

FIG. 15 is a block diagram of a basic multi-value processor with a switching function in accordance with the present invention.

DETAILED DESCRIPTION OF THE PREFERRED EMBODIMENT

Figure 1:
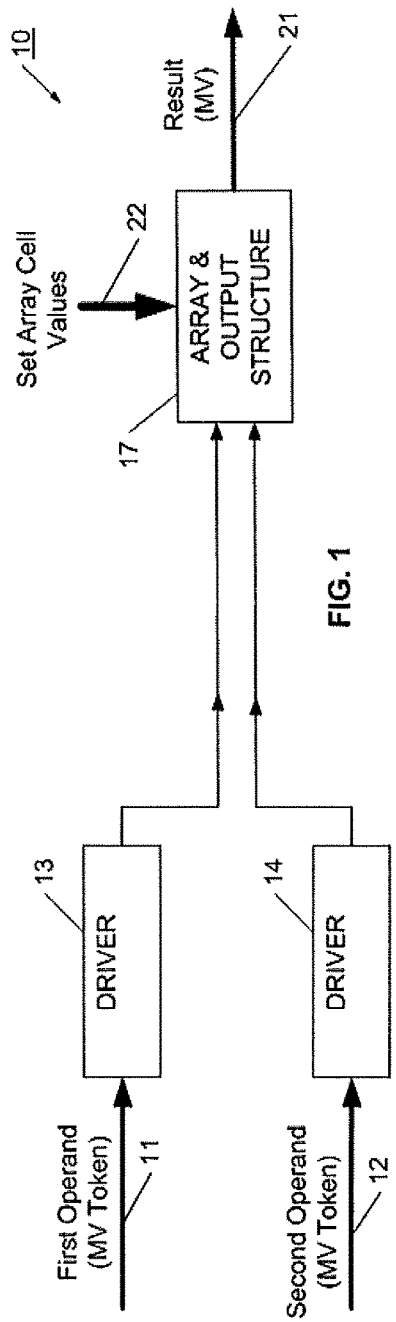
FIG. 1 is a block diagram of a basic multi-value processor in accordance with the present invention.

Referring now to FIG. 1 an efficient and scalable multi-value processor is illustrated. It will be understood that the processor 10 is illustrated as a simple processing device. However, the same constructions and processes may be used to implement highly complex processing units. Processor 10 has driver 13 receiving a first multi-value operand 11, which may be referred to as a token. This multi-value operand or token is a voltage signal and may include 4 states, 8 states, 16 states, 32 states, or any number of states depending upon the selected technology and sensitivities of the sensors. Although it is often useful to have the number of states be a base on a power of 2 (4, 8, 16, etc.), the device of FIG. 1 may be configured to accommodate other numbers of states, for example 3, 5, 7 or 10. An optional driver 14 receives a second multi-value operand 12. It will also be understood that the functions of driver 13 and driver 14 may be combined into a single structure. The drivers determine which value is set for each of the multi-value operands, and passes that information to an array structure 17. Array structure 17 has each of its cells associated with a particular multi-value result. More particularly, array structure 17 has a series of rows and columns, where a particular value is associated with the intersection of each row and column value. The drivers (13, 14) are used to select which respective row and column will be selected out of the array. The multi-value voltage present at the particular intersection of the selected row and column is then passed through as result 21. A set of lines 22 may be used to set the voltage value for individual cells. In some cases the cells may be set to a fixed value, and in other cases the voltage state at a particular cell is set responsive to outputs from other parts of the system circuit.

For simplicity of describing the efficient and scalable processor 10, examples herein will be limited to a 4 data state multi-value system. However, it will be appreciated that other numbers of levels may be used.

Figure 2:
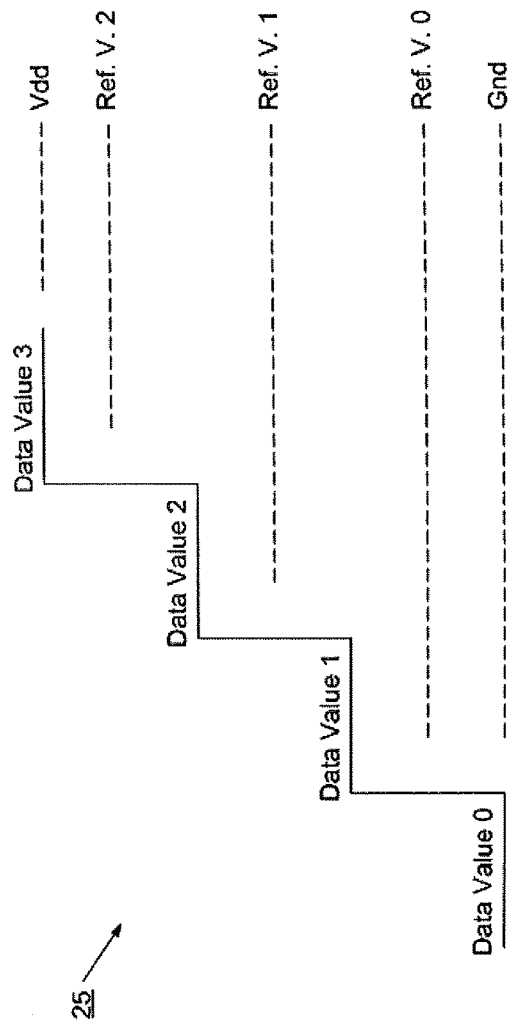
FIG. 2 is an example of multi-logic levels used in a multi-value processor in accordance with the present invention.

Referring now to FIG. 2, a typical 4 level multi-value system is illustrated. FIG. 2 shows an operand voltage that may be adjusted between ground (GND) and Vdd. In this example, a GND setting defines a 0 state, and Vdd defines the 3 state. To enable 4 data states, 3 reference voltages are defined. More particularly, a multi-value operand that is below Ref0 will be considered a 0 data value. A multi-value operand that is above Ref0 but below Ref1 will be considered a 1 data value. A multi-value operand that is above Ref1 but below Ref2 will be considered a 2 data value. A multi-value operand that is above Ref2 will be considered a 3 data value. Here the reference voltages are spaced evenly apart; however it will be appreciated that other non-even divisions may be made. It will be understood that defining more reference voltages will define more available data states. It will also be understood that the reference voltage levels may be static, and in other cases set dynamically responsive to circuit conditions or applications.

Due to the increased amount of information carried on each bus in a processor, the number of wires with a wiring harness may be dramatically reduced. Due to the increased amount of information carried on each line in a processor system, the number of wiring connections and wiring harnesses may also be dramatically reduced. Further, highly efficient and energy conserving circuit arrangements can be made. Finally, the use of multi-value systems increases the symmetry allowed for circuit blocks, and allows for simplified fan out and scalability.

Figure 3:
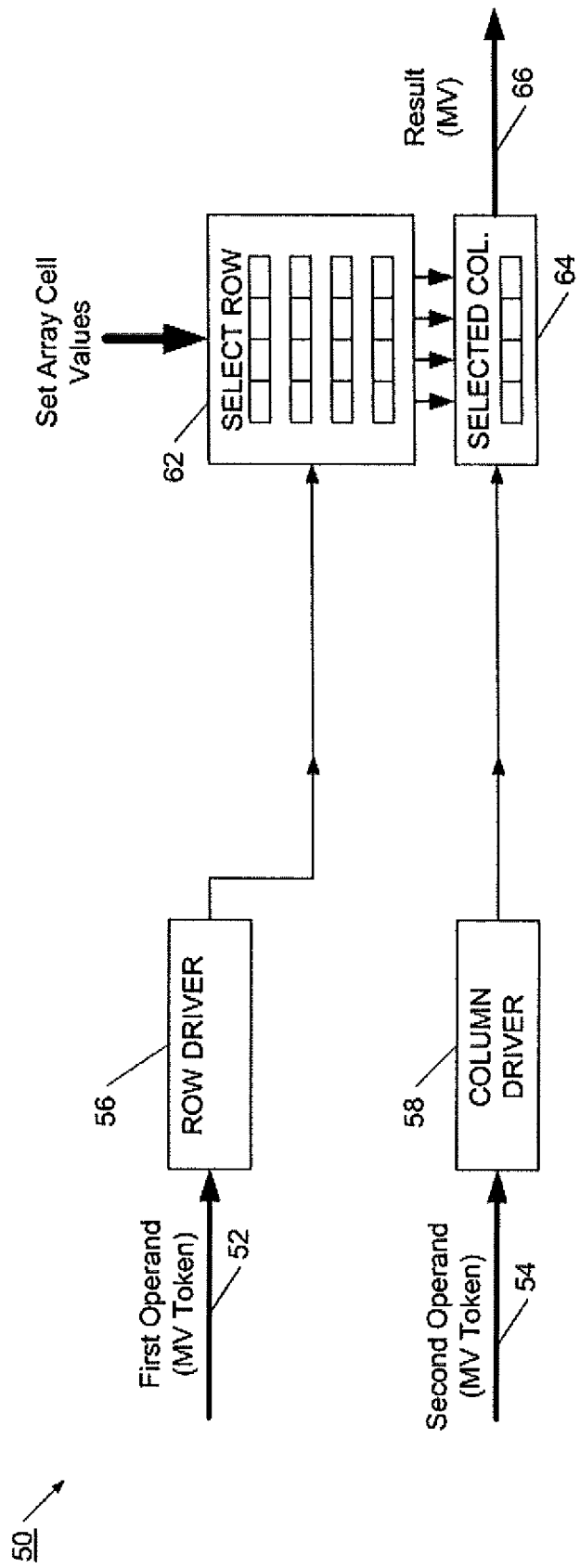
FIG. 3 is a block diagram of a basic multi-value processor in accordance with the present invention.

Referring now to FIG. 3, another efficient and scalable processor system in accordance with the present invention is illustrated. Multi-value processor 50 also receives a first operand 52 and a second operand 54 into the row 56 and column 58 drivers, respectively. As before, these drivers 56 and 58 sense the voltage level of the operands, and determine which rows and column should be selected. However, in contrast to the processor illustrated in FIG. 1, processor 50 uses a two-path process: first, using driver 56 for selecting a row from array 62, passing that row into a column selection output structure 64, and then using driver 58 for selecting a column. As illustrated, the first operand/token 52 uses row driver 56 to select one of four rows from the array 62. The selected row is then dropped into a column select structure 64. The second operand/token 54 is analyzed by column driver 58, and determines which of the columns to select. The voltage value from the selected column is then passed through to result 66.

Importantly, the values in array 62 are not in the form of a lookup table, but are connected to multi-value voltage lines for setting their voltage level. In this way, individual cells may be fixed to a particular value, or may be varied dependent on values or signals from other parts of the circuit or from external circuits or applications.

Figure 4:
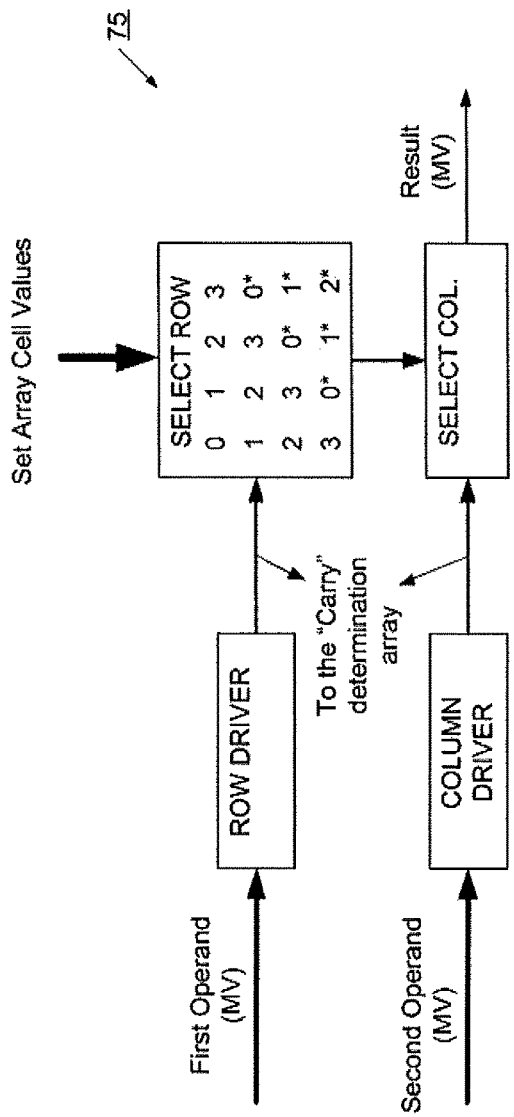
FIG. 4 is a block diagram of the basic multi-value processor of FIG. 3 implementing a specific function.

Referring now to FIG. 4, a particular implementation of processor 50 is illustrated by processor 75, which is constructed to implement a simple addition function. It will be understood that the first and second operands may take the voltage values representing zero, one, two, or three. Accordingly, the first operand is received into the row driver, which selects one of four available rows. The second operand is received into the column driver, and is used to select one of four available columns with the resulting output as illustrated. The array has been populated with multi-value voltages according to an addition process. For example if the first operand is value zero, and a second operand value is also zero, then the intersecting row zero in column 0 result in the passing of a zero voltage out to the rest of the circuit. Again, it is important to understand that the array is not populated with preset values, but instead has values which relate to one of four multi-value states. The individual voltage levels available at each cell/row intersection are then simply passed through onto the result. The values in the array may be fixed, or may be varied so that a single structure is able to implement different functions depending on system states. The array illustrated in FIG. 4 is shown to determine the value of the least significant digit, but does not illustrate the associated determination of a carry value, if any. Instead, the digit value is denoted with a "*" if a carry value would also be present. In practice, a single driver would simultaneously drive a second array, with the second array constructed to determine and output the appropriate carry value. It will be appreciated that the carry array acts like the digit array described with reference to FIG. 4.

Figure 5:
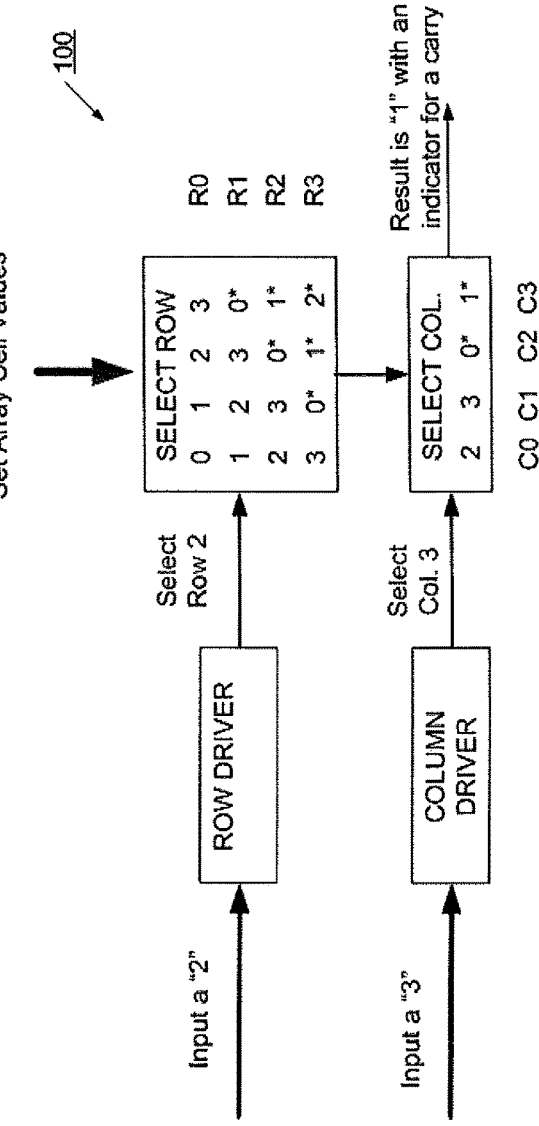
FIG. 5 is a block diagram of the basic multi-value processor of FIG. 3 implementing a specific function.

Referring to FIG. 5, a specific implementation of processor 75 is illustrated. Processor 75 implements an addition algorithm, and processor 100 shows how a "2 added to 3" function operates. The first operand 2 is input into the row driver which determines that row 2 should be selected. Row 2 drops into the select column buffer. Each of values in row 2 are placed into the output structure and are available in the select column buffer. Three is input into the column driver and selects column 3 for the result. As illustrated, column 3 in the select column buffer contains a 1, therefore a 1 is output as a result for the least significant digit value. The same multi-value operands were input to a "carry" array, which would generate a "1" output, indicating that the addition resulted in a "1" carry value (which would have a numeric value of 4 in base 5 or higher). Thus, the carry indicator acts as a signal for use by other arrays within the overall circuit. It will be understood that the carry indicator signal can be implemented in a variety of ways. For example, it has been found that using a carry signal at a higher voltage, near or at Vdd, enables faster computations as compared to a lower voltage signal. It will be appreciated that any number of algorithmic processes may be implemented using such an array and pass-through system.

Figure 6:
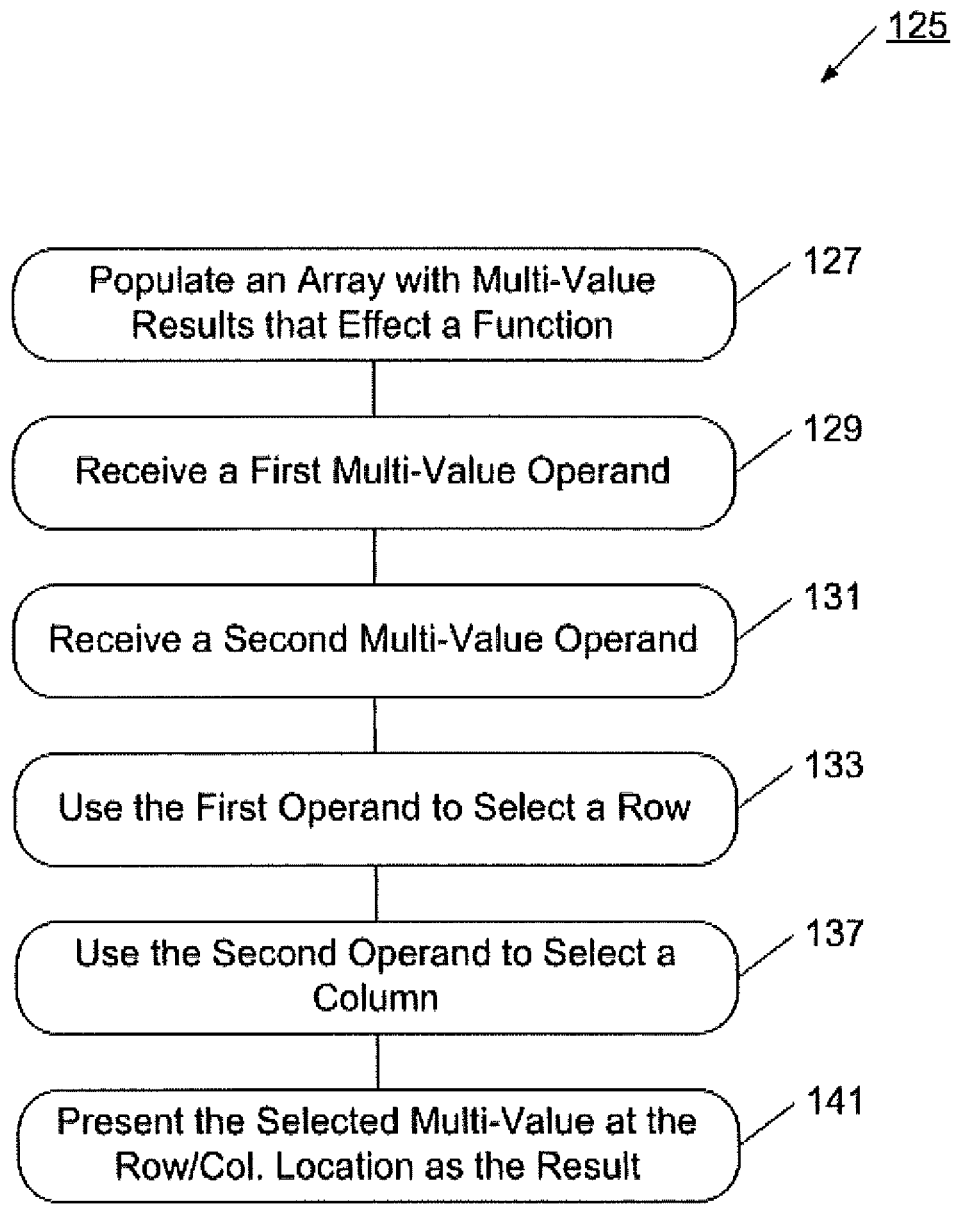
FIG. 6 is a flow diagram of a basic multi-value processor in accordance with the present invention.

Referring now to FIG. 6, a flowchart of an efficient and scalable multi-value processor is illustrated. As illustrated in block 127, an array is populated with multi-value pass-through voltages that affect a particular function. For example, as previously discussed, an Array may be populated with pass-through voltages that implement a multiplication function. A first multi-value operand is received by the system as shown in block 129 and the system receives a second multi-value operand as shown in block 131. It will be understood that in implementation the operands may be received in any order. The first operand is used to select a row in the array as illustrated at block 133 while the second operand is used to select a column in row 137. As previously discussed the selection process may be operated upon a single array, or as later illustrated, a row may be dropped into a separate column select buffer and the column selected as a second process. Finally the voltage at the selected row and column is passed through and interpreted as the result of the process as shown in block 141.

Figure 7:
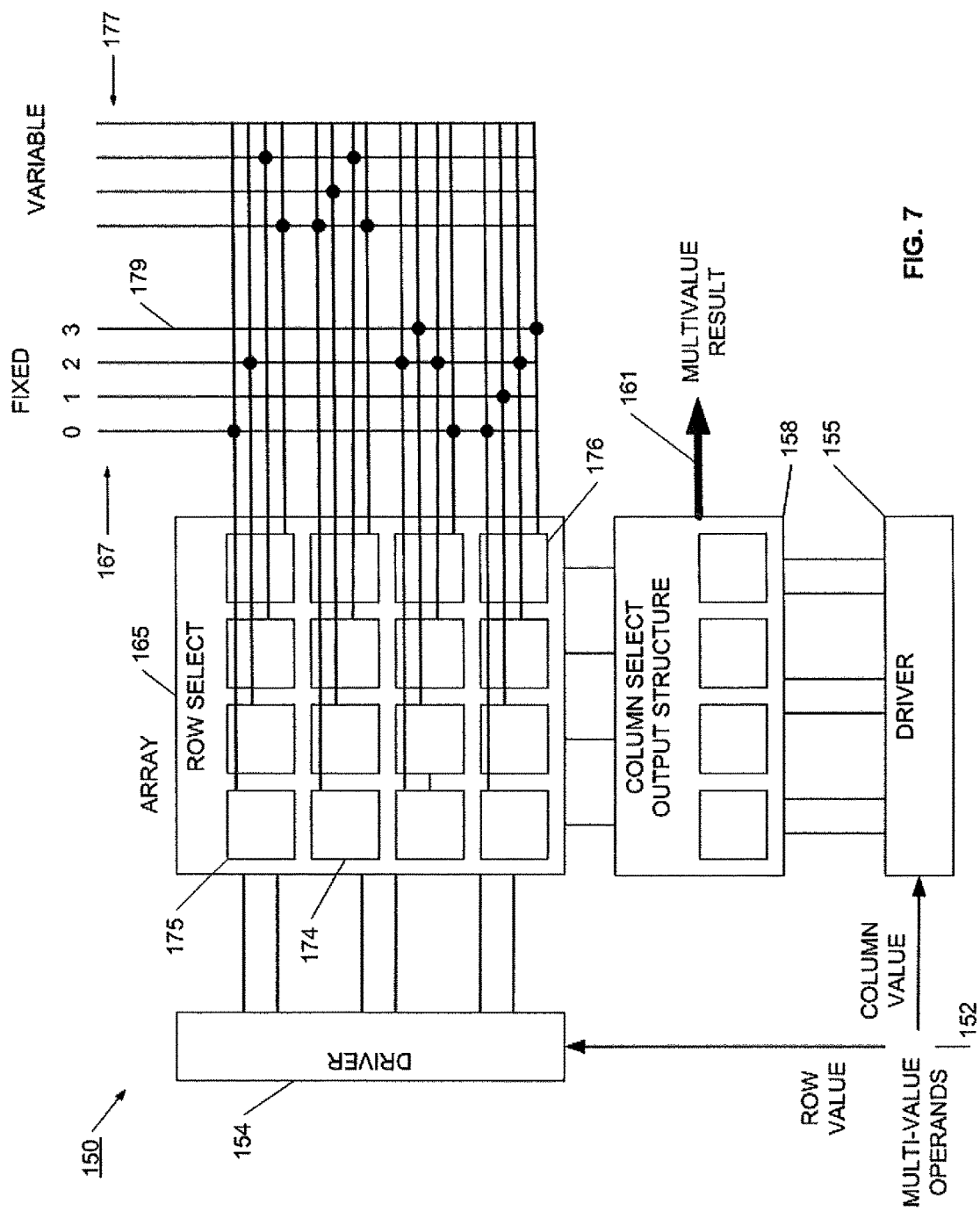
FIG. 7 is a block diagram of a multi-value processor in accordance with the present invention.

Referring now to FIG. 7, a more particular implementation of the multi-value processor 50 of FIG. 3 is described. Processor 150 receives multi-value operands 152 which are then received into row driver 154 and column driver 155. Row driver 154 is used to select 1 of 4 available rows, and the selected row is dropped into a column output structure 158. The column output structure acts as a second stage for the cell selection process. It will be understood that using a row/column stage selection process is just one of several alternative ways to structure a multi-stage cell selection process. The multi-value operand received into column driver 155 is used to select one of the four available columns and thereby allows a pass-through of a multi-state value 161. The array 165 has a series of cells at intersecting row and column positions. Each one of these cells has a line connecting it to a particular voltage level. In some cases these voltage levels may be fixed 167 or they may be variable 177, or any combination of fixed and variable.

The fixed lines 167 typically will represent the states zero, one, two, and three respectively. The variable lines will also represent one of the four states, but their value will be adjusted according to results obtained from other parts of the circuit. For example, cell 175 which is at the intersection of row 0 and column 0 is fixed to a value of 0. In a similar way, cell 176 which is at the intersection of row 3 and column 3 is fixed to a value of 3. Cell 174 which is at the intersection of row 1 column 0 is coupled to one of the variable lines, so its value is determined by another portion of the larger system circuit.

In operation the driver 154 uses its operand to select which row to drop into the column output structure 158. The column driver 155 uses its operand to select a particular column, and when a cell is selected the voltage from either the applicable fixed or variable line is passed through as the multi-value result 161. The multi-value processor uses a driver for determining which of four states is being selected, and thereby informs the array which respective row or column should be selected.

A set of sense amps is used in each driver, with each sense amp associated with each available reference voltage. In this way, the outputs from the sense amps can be used in the array to determine what row or column should be used. Before discussing the overall driver structure, detail of each sense amp is described. It will be understood the sense amps may be identical, but that depending on the manufacturing geometry used, fewer reference lines and sense amps can be used.

In one simplified arrangement, the array structure of FIG. 7 could have only two rows and two columns, and the multi-value operands are restricted to two states. This construction can be used, for example, to implement a simple two-state to higher-state converter, or to enable a binary-based circuit to effect values or signals in a higher-state assembly.

Figure 8:
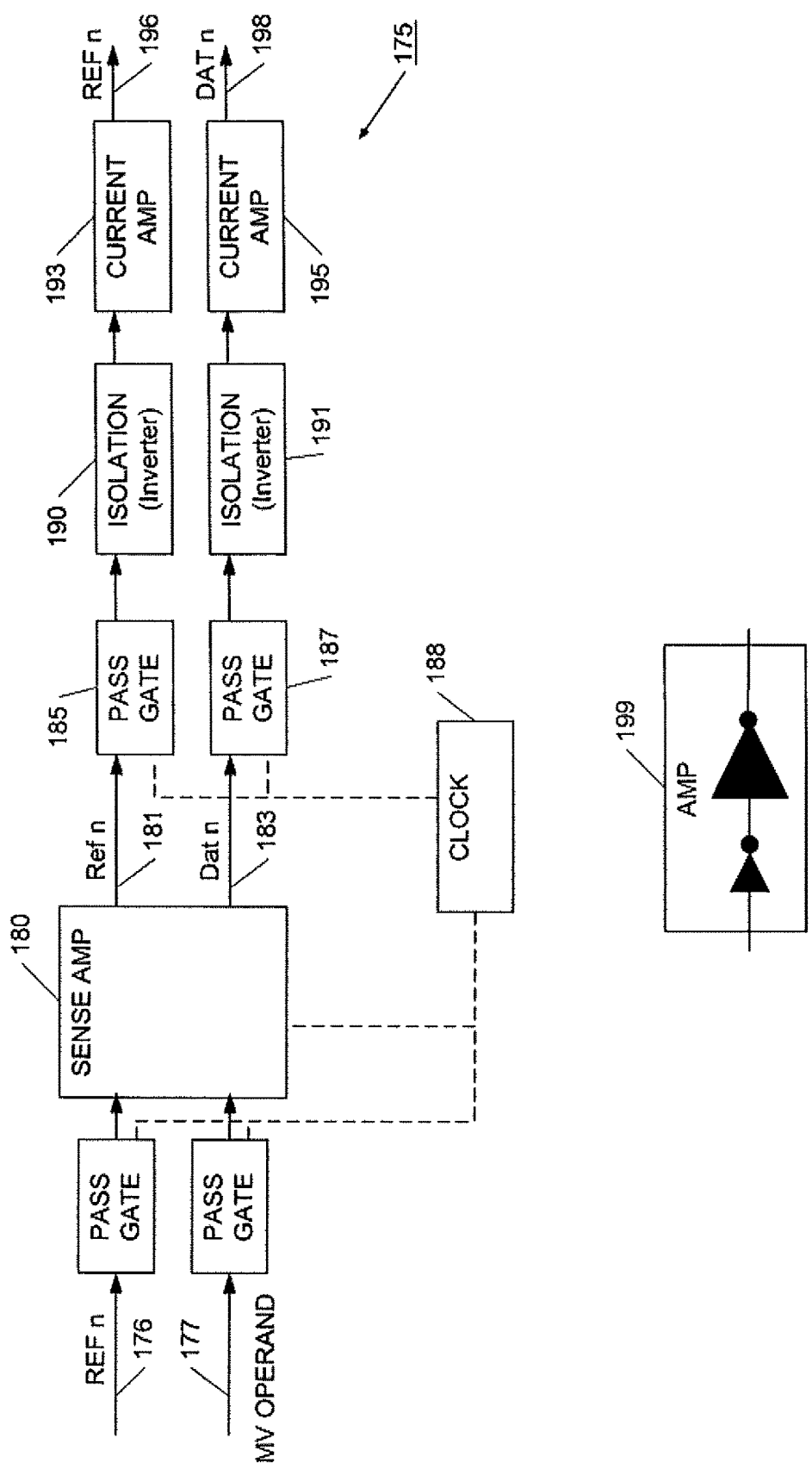
FIG. 8 is a block diagram of a sense amp circuit for use in a multi-value processor in accordance with the present invention.

Referring now to FIG. 8, an implementation for a sense amp for use in a driver circuit is illustrated. Each sense amp, such as sense amp 180, is constructed to compare one of the reference voltages to the multi-value operand. Accordingly, a driver will have multiple sense amps, each configured to a particular voltage range according to the number of defined data states. Sense amp 180 receives two inputs: a reference voltage 176 and the multi-value operand 177. It will be understood that the inputs to the sense amps will be gated by a clock to reduce power consumption and reduce possible race conditions. Generally, the sense amp is used to compare the reference voltage 176 to the voltage 177 of the multi-value operand state. If the multi-value voltage 177 is less than the reference value 176, then the reference out 181 is driven to Vdd and thereby has a high state, while the data out 183 is driven to ground and thereby has a low state. If the multi-value voltage 177 is greater than the reference value 176, then the reference out 181 is driven to ground and thereby has a low state, while the data out 183 is driven to Vdd and thereby has a high state.

Since sense amp 180 consumes power whenever actively comparing voltage inputs, it is useful to only operate the sense amp 180 when a comparison is ready to be made. Accordingly, a clock 188 is used to keep the sense amp off, except only for the brief time when the sense amp functionality is needed. Such clock control saves considerable power, and reduces heat dissipation. However, a sense amp in an off state may float to an unknown mid-level state. In this condition, follow-on devices and circuits may be activated, thereby using additional power, and leading to indeterminate computational results. To avoid this uncertainty, the clock also drives a set of pass gates 185 and 187. Accordingly, the reference out signal 181 is only passed to the isolation block 190 when the sense amp is on, and in a similar manner the data out signal 183 is only passed to the isolation block 191 when the sense amp is on. It will be understood that other devices may be used to gate the reference and data signals.

Isolation blocks 190 and 191 are used to isolate the sense amp 180 from the effects of follow-on circuitry and noise. Typically, each isolation block 190 and 191 will be an inverter. Importantly, the size of the inverter may be selected to implement and enhance certain circuit features. A sense amp is very sensitive to erratic balance conditions, so the inverter needs to be large enough to balance the outputs of the sense amp. However, a larger inverter will also act to slow the sense amp and inverter performance. In this way, a particular sense amp/inverter configuration can be carefully tuned for dramatic increases in speed and response. Just as smaller sized inverters increase speed and response, larger inverters have increased accuracy and sensitivity. Accordingly, making the inverters larger will slow the circuit down, but may be useful in highly noisy environments, or when many data states are needed. The system designer has great flexibility in trading off speed with sensitivity according to the selected size for the inverter. Also, the inverter has the function of changing a high state to a low state, and a low state to a high state.

The outputs from the isolation blocks 190 and 191 are received into current Amps 193 and 195 respectively. Current amps 193 and 195 may be selected and sized to enable significant fan out and scalability to the circuits described herein. For example, a driver circuit may be used to drive several different array sets, with the current amp providing sufficient current for proper function and robustness of the final circuit. The current amps 193 and 195 may be one or more inverters as illustrated in block 199. It will be appreciated other devices may be used for amplification. For example, it will be appreciated that one or more op-amps may be used. The size, type, and number of inverters or op-amps may be selected according to the expected level of fan out for a particular driver and array circuit. The current amps 193 and 195 output REF n 196 and DAT n 198 signals that are received into an array, as further described below with reference to FIG. 10.

Figure 9:
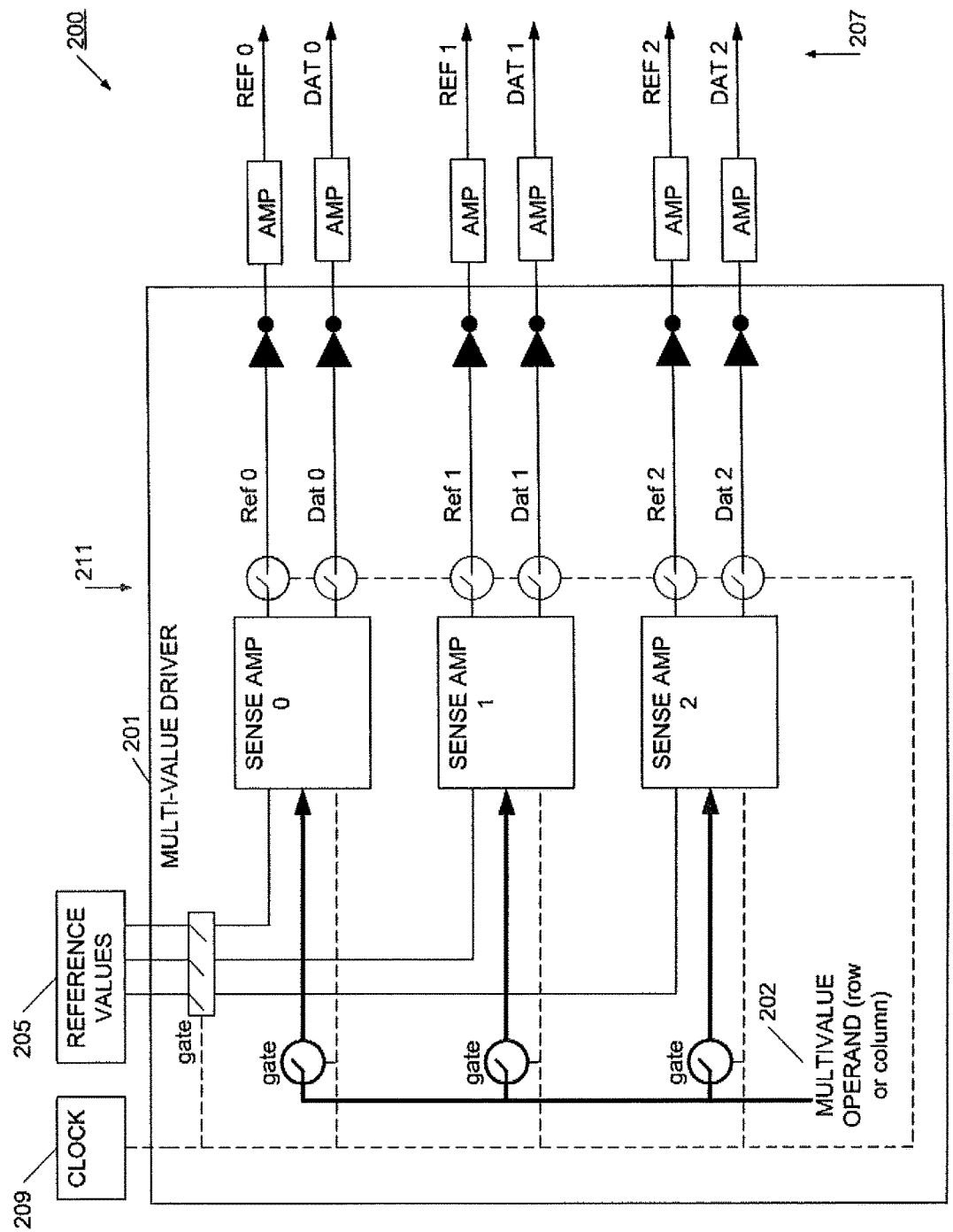
FIG. 9 is a block diagram of a driver circuit for use in a multi-value processor in accordance with the present invention.

Referring now to FIG. 9, a more complete driver circuitry 200 is illustrated. The driver circuit for the row driver is similar to the column driver, so this description applies to both types of drivers. The multi-value driver 201 has three sense amp circuits as more particularly described with reference to FIG. 8. Three sense amps are used as this circuit is constructed to operate with 4 multi-value voltage states. It will be understood that more sense amps would be used for systems having 8, 16, or more multi-value states. The multi-value operand for a row or column 202 is input into each of the sense amps. Reference values 205 are received into each of the three sense amps. It will be understood that the inputs to the sense amps will be gated by a clock to reduce power consumption and reduce possible race conditions. Each sense amp operates as previously described to output a reference and data value. These six values 207 are then received by the array for making a row or column selection. It is important in this example to understand that the driver circuitry 201 is the same for both row and column driver functionality. A clock 209 will be used to clock each of the sense amps as well as gates 211 in the sense amp circuits. Gates will also be clocked on the operand and reference lines for increased isolation and reduced power consumption. By timing the activities of the sense amps and the gates, race conditions will also be reduced. Also, power consumption is reduced by having the sense amps only active when needed, along with improved circuit robustness.

Figure 10:
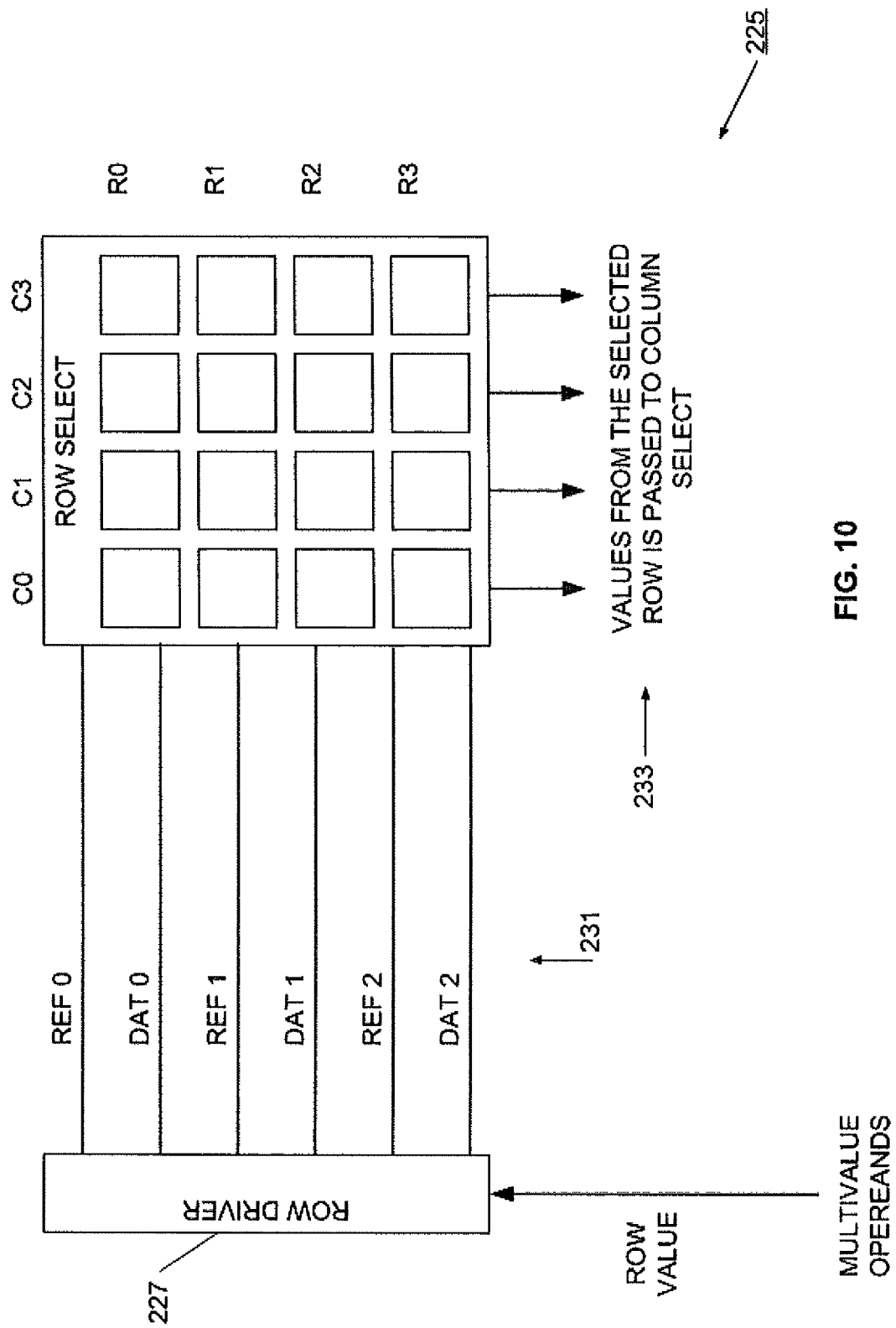
FIG. 10 is a block diagram of using a driver circuit to select rows from an array in a multi-value processor in accordance with the present invention.

Referring now to FIG. 10, circuit 225 shows the driver circuitry of FIG. 9 implemented as driver 227. This driver circuit 227 outputs six values as illustrated. Driver 227 is configured as a row driver; as it is coupled to the row select array. Depending upon the digital values on the six lines 231, a particular row will be selected. For example, one combination of values on lines 231 may cause row zero to be passed to the column select area 233, while another combination of values on lines 231 may cause row 2 to fall to the column select structure. Once a row has been selected, then a similar driver is used to select the particular column for use.

Figure 11:
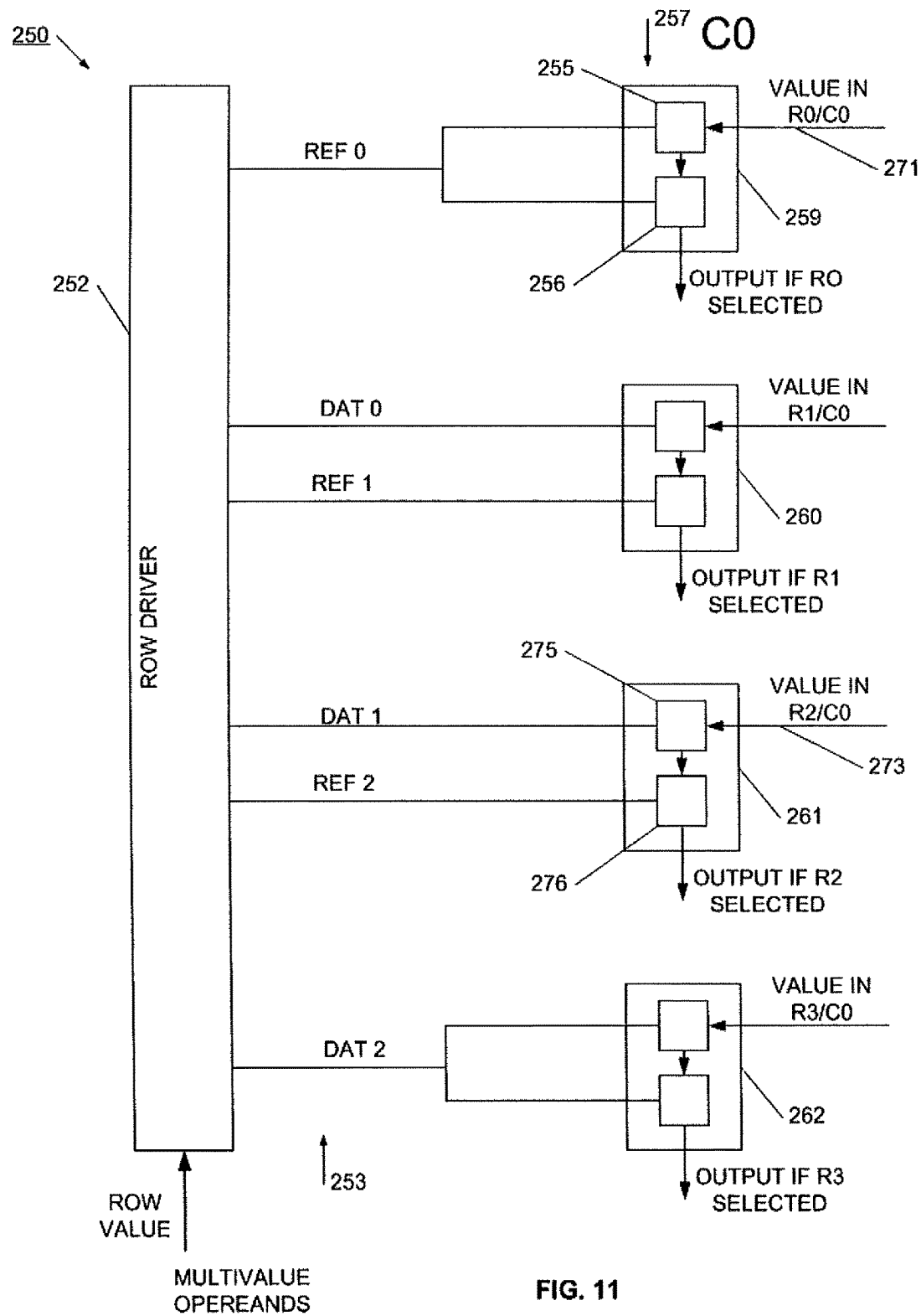
FIG. 11 is a block diagram of an Array-column circuit for use in a multi-value processor in accordance with the present invention.

Referring now to FIG. 11, additional detail is provided for the row array select structures. As illustrated in FIG. 10, the driver 227 outputs six reference and data lines 231. Those six lines 253 are received into the array. FIG. 11 shows column 0 from a 4×4 row select array. Each column is connected to the driver in a similar manner, so only column 0 is described in detail. Cell 259 shows the cell at the intersection of row 0 column 0. Cell 260 shows the cell at intersection of row 1 column 0. Cell 261 shows the cell at the intersection of row 2 column 0, and finally cell 262 shows the cell at intersection of row 3 column 0. Each cell (259, 260, 261, and 262) is constructed with two pass-through transistors.

As described earlier, each cell is set to a voltage that defines one of the available data states, or a voltage level set by some other part of the circuit. If that cell is selected, then that voltage is passed-through to the column select substructure. Each cell may be connected to a line that has a fixed value, or to a line that has a variable value set according to other parts of the processor. Here, line 271 is used to set the available pass-through voltage at cell 259, and line 273 is used to set the available pass-through voltage at cell 261.

Cell 259 is shown with pass-through transistors 255 and 256, while cell 261 is shown with pass-through transistors 275 and 276. If the value on REF 0 is set high, both transistor 255 and 256 will act as pass-through transistors, and the voltage of line 271 will be passed to the column output. If REF 0 is low, then the transistors 255 and 256 will block the voltage of line 271. It will be understood that cells 259 and 261 may use a single pass-through transistor, but using two allows for more reuse of devices and better overall symmetry. In a second example, if DAT 1 is high, then the voltage on line 273 will pass-through transistor 275 to transistor 276. If REF 2 is also high, then the voltage of line 273 will be output to the data structure. However, if either DAT 1 or REF 2 is low, then the voltage on line 273 will be blocked.

Referring now to FIG. 12, a truth table 280 is illustrated showing how Rows are selected according to the states of the transistors within each cell. As can be seen, row 0 is only selected when the two transistors connected to REF 0 are set to high, which causes each transistor to go into a "pass" state. If REF 0 is low, then both transistors will be set to a "block" condition. In a similar way, row 2 is only selected when DAT 1 is high (pass) and REF 2 is high (pass), otherwise one or both of the transistors will block row two from passing to the column select structure. In this way, the two transistors act to rigidly assure that only one of the rows is selected.

Referring now to FIG. 13, a truth table 290 is illustrated showing the 6 output lines from the driver, but arranged according to which sense amp is connected. The 6 driver lines will set differently depending on which operand is present on the operand multi-value input line. The values of the lines are then used to set the transistors in the cells to either pass or block the voltage defined for each cell. The circled driver values show both transistors for a cell will be in the pass mode, and therefore the only condition when the voltage will pass-through. More particularly, if the driver is a row driver, a 0 multi-value operand will select row 0, a 1 multi-value operand will select row 1, a 2 multi-value operand will select row 2, and a 3 multi-value operand will select row 3. If the driver is a column driver, a 0 multi-value operand will select column 0, a 1 multi-value operand will select column 1, a 2 multi-value operand will select column 2, and a 3 multi-value operand will select column 3.

Referring now to FIG. 14, another multi-value processor is illustrated. Processor 300 is similar to processor 10 described with reference to FIG. 1, so only differences between the two processors will be described. The processor 300 of FIG. 14 has an additional switching matrix 302 that sits between the drivers and the array. In this way, the outputs from the drivers may be changed according to application needs. More particularly, a single array may be used to implement a number of functions, merely by rearranging the inputs received from the drivers. Such a switch greatly increases the efficiency of the system, and enables a single geometric structure to perform many functions. In another optional example, a switching matrix 304 may be used to adjust the input lines. This adjustment may be made on the fixed lines, the variable lines, or both. In this way inputs received from other parts of the system, as well as the set reference lines, maybe adjusted to provide for reuse of an array structure. Each switching matrix may have control lines from other parts of the processor that set the switch configuration. In other cases, the switch may be fixed, thereby allowing a single array structure to be used in differing applications simply by reconfiguring a switch.

Referring now to FIG. 15, another processor 325 is illustrated. Processor 325 is similar to processor 50 described with reference to FIG. 3 and therefore will not be described in detail. Processor 325 has a switching matrix 327 between the row driver and select row array. In this way, the processor 325 can use the same array for multiple functions. In a similar manner, switching matrix 329 is between the column driver and the column select structure. It will also be appreciated that the switching matrix 327 and 329 may be under program control and circuit switching functions may be adjusted according to results and other parts of the application system. This switching flexibility enables significant reuse of the array structures. A switching matrix 331 may also be used to switch the fixed, variable, or both input lines to the array. The flexibility brought by the matrix switches, both from the driver and from the value setting lines, enables greater efficiencies, scalability, symmetries, and flexibility within the system. In particular, the switching matrix enables increasingly smaller geometries to implement far more sophisticated functionality.

Figure 16:
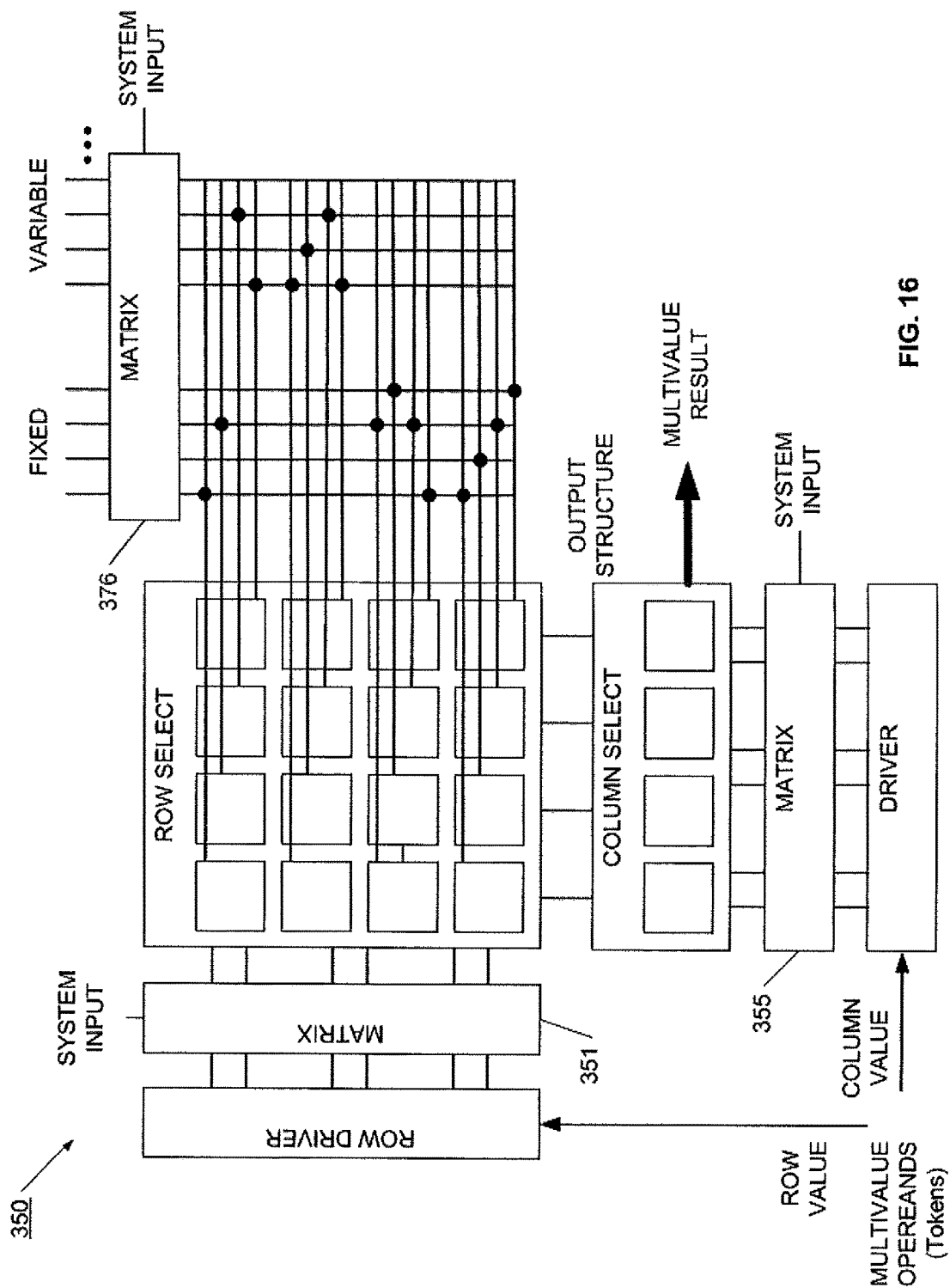
FIG. 16 is a block diagram of a multi-value processor with a switching function in accordance with the present invention.

Referring now to FIG. 16, another processor similar to processor 150 described with reference to FIG. 7 is illustrated. Processor 350 has a switching matrix 351 between the row driver and the row select array. This switching matrix enables increased flexibility and reduced geometries by allowing flexibility on setting which rows are selected by the driver. It will be appreciated switching matrix 351 may be controlled from other application processes. In a similar manner as described above, switching matrix 355 sits between the column driver and the column output structure. This switching matrix also reduces geometries and allows for greater flexibility, and may be driven from other parts of the application. Finally a switching matrix may be used to switch fixed and variable lines as shown at block 376. As with all the switching matrixes, this matrix is useful if for increasing flexibility and reducing geometries.

Figure 17:
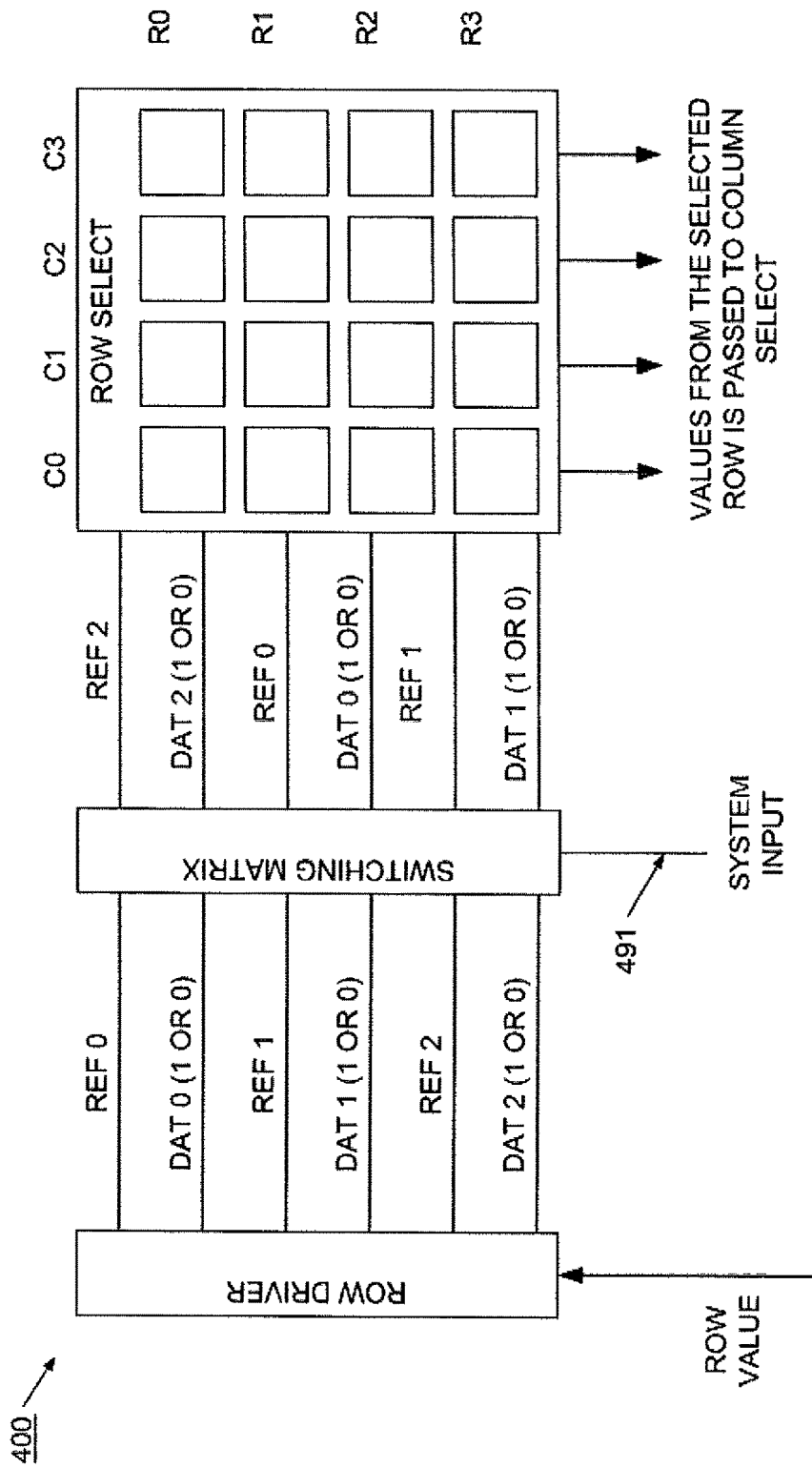
FIG. 17 is a block diagram of a specific switching example for a multi-value processor in accordance with the present invention.

FIG. 17 illustrates a specific sample of placing a switching matrix in a row driver configuration. As illustrated the row driver outputs its standard six signals used by the row select array. However, the switching matrix adjusts those according to a system input 491. It will be appreciated that many differences in inputs may be used. In this particular case the inputs from the driver are switched to affect a different row selection from the row select block. It will be appreciated a wide number of matrix switching and system input and functionality may be used. It will also be appreciated that the switching matrix illustrated here may be used by column driver lines, the fixed setting lines, or the variable fixed lines.

Figure 18:
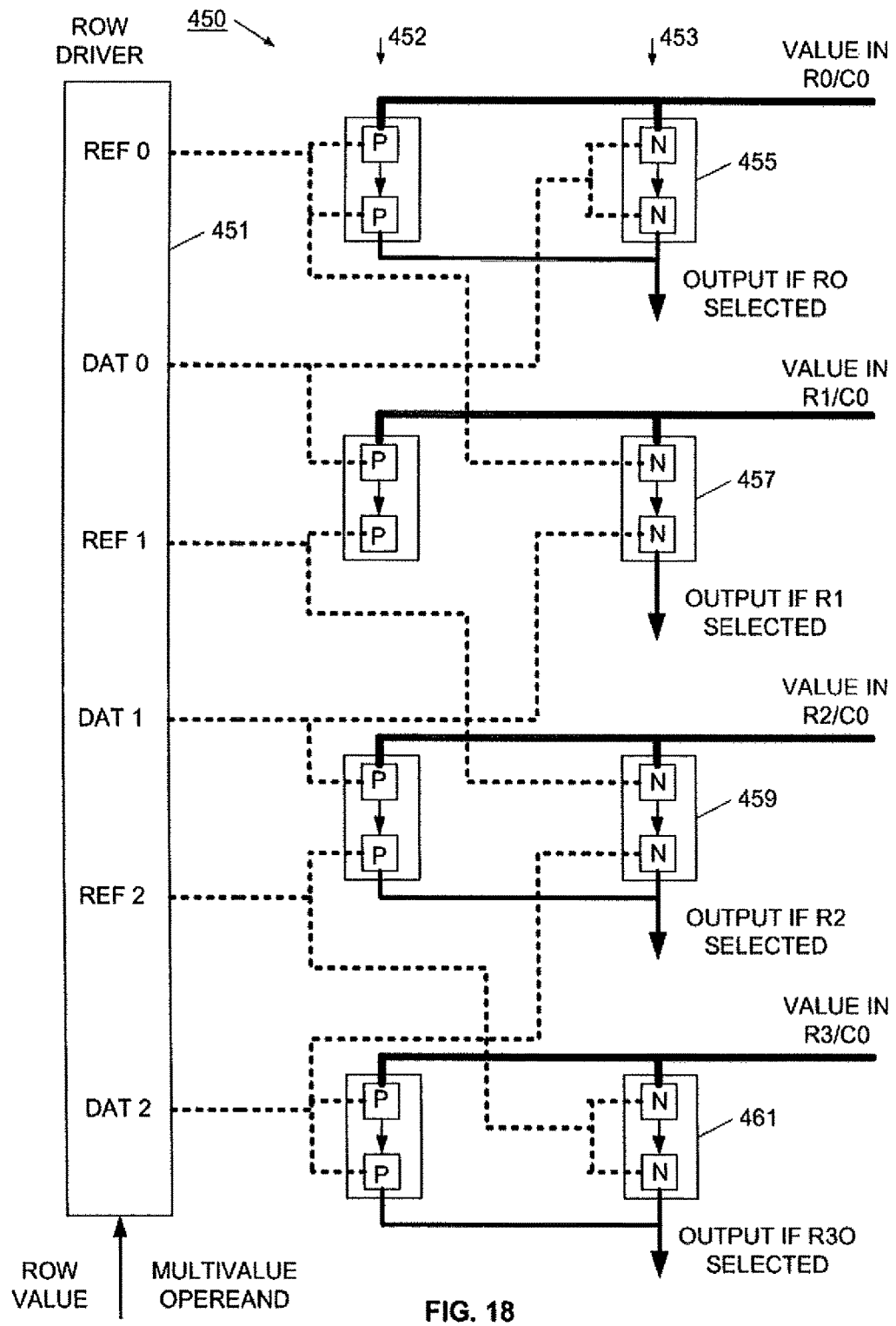
FIG. 18 is a block diagram of an array-column circuit for use in a multi-value processor in accordance with the present invention.

Referring now to FIG. 18, another implementation of a driver and array is illustrated. More particularly, the construction illustrated in FIG. 18 is provided to significantly increase the speed, efficiency, and pass-through rates for the driver and array. Although the fast driver/array structure is illustrated for use as a row select, it will be understood that the same structures apply to the column output structure.

Generally, driver system 450 is an extension of the driver system described with reference to FIG. 11. For example, the driver circuit 451, the pass-through transistors 452, and the "Value In" lines are all the same as described in FIG. 11. Driver system 450 adds a new set of pass-through transistors 453 that operate in parallel with pass-through transistors 452. It has been found that speed and reaction time for pass-through transistors is very sensitive to the driving voltage, and that "N" and "P" transistors react oppositely in their change to response time. That is, if a particular voltage on the "Value In" line causes a relatively slow response in a "P" transistor, then that same "Value In" voltage level will cause a relatively fast response in an N" transistor. Accordingly, in FIG. 18 each "Value In" line is connected to both a pair of "P-type" pass-through transistors as well as a pair of "N-type" pass-through transistors.

In FIG. 18 the outputs from the "P" and "N" transistor pairs are connected together. In this way, whichever transistor pair reacts faster to a particular "Value In" voltage will be the first to pass the "Value In" voltage to the "Output" line. In this way, for any voltage presented on the "Value In" line, the faster response will be invoked. It will be appreciated that the slower transistor pair will activate at a later time, but will have no slowing effect as the faster pair has already passed the voltage through to the output line.

It will also be understood that "P" and "N" transistors use different activation voltages, so the driving lines need to be adjusted accordingly. For example, the "P" transistors in Row 0 are driven by the "REF0" driver lines (as described in FIG. 11), while the "N" transistors 455 are driven by the DAT0 driver lines. In a similar manner, the "N" transistors 457 for row 1 are driven by REF0 and DAT1, and the "N" transistors 459 for row 2 are driven by REF1 and DAT2 driver lines. Finally, the transistors 461 for row 3 are driven by the REF2 driver lines.

While particular preferred and alternative embodiments of the present invention have been disclosed, it will be appreciated that many various modifications and extensions of the above described technology may be implemented using the teaching of this invention. All such modifications and extensions are intended to be included within the true spirit and scope of the appended claims.

What is claimed is:

1. A multi-value processor, comprising:
an array of cells arrange in a row and column configuration, each cell connected to a respective voltage signal result, each cell blocking the voltage signal result from being passed through that cell;
a row driver receiving a multi-value row operand having a plurality of voltage levels, the row driver constructed to generate a set of row driver signals responsive to the received voltage level of the multi-value row operand;
a column driver receiving a multi-value column operand having a plurality of voltage levels, the column driver constructed to generate a set of column driver signals responsive to the received voltage level of the multi-value column operand; and
wherein each cell is connected to at least one of the row driver signals, and responsive to the state of the row driver signal(s) cells in one selected row pass their respective voltage signal result to an output sub-structure, and responsive to the state of the column driver signal(s), the cell in one selected column in the output sub-structure passes its respective voltage signal result as an output.

2. The multi-value processor according to claim 1 wherein the row driver and the column driver each comprise a set of sense amps for generating the row driver signals and the column driver signals, respectively.

3. The multi-value processor according to claim 2, wherein at least one cell of the array further comprises a pair of pass-through transistors, each transistor of the pair of transistors having a pass state and a block state, the pair of transistors connected so that the one cell's respective voltage signal result is passed only when both transistors of the pair of transistors are in the pass state, and each respective transistor of the pair of transistors sets its pass or block state responsive to at least one of the row or column driver signals.

4. The multi-value processor according to claim 3, wherein at least one of the cells in the array are connected such that both transistors of the pair of transistors are connected and act responsive to the same row or column driver signal.

5. The multi-value processor according to claim 3, wherein at least one of the cells in the array is connected such that each of the transistors in the pair of transistors is connected and acts responsive to a respective driver signal that comes from a same sense amp.

6. The multi-value processor according to claim 3, further comprising:
a second pair of pass-through transistors that act in parallel to the pair of pass-through transistors, the second pair of pass-through transistors selected (1) to react faster than the pair of pass-through transistors at some voltage levels, and (2) to react slower than the pair of pass-through transistors at other voltage levels; and
wherein the pair of pass-through transistors and the second pair of pass-through transistors are arranged such that the one cell's respective voltage signal result is first passed through the faster reacting pair of pass-through transistors.

7. The multi-value processor according to claim 6, wherein one pair of pass-transistors uses two N-type transistors and the other pair of pass-through transistors uses two P-type transistors.

8. The multi-value processor according to claim 3, wherein the pair of pass-through transistors are both N-type transistors.

9. The multi-value processor according to claim 3, wherein the pair of pass-through transistors are both P-type transistors.

10. The multi-value processor according to claim 2, wherein the multi-value row and column operand(s) each represent n values, and each row driver and column driver each use only (n−1) sense amps to generate sense amp signals.

11. The multi-value processor according to claim 2, wherein the multi-value row and column operand(s) each represent n values, and each row driver and column driver each use only (n−1) sense amps to generate (n+2) sense amp signals.

12. The multi-value processor according to claim 2, wherein the voltage signal result for either the row or column voltage signal result has more than two voltage states.

13. The multi-value processor according to claim 2, wherein each of the sense amps comprises an isolation block in the form of an inverter in its output signal path.

14. The multi-value processor according to claim 2, wherein each of the sense amps comprises a current amp in its output signal path.

15. The multi-value processor according to claim 2, wherein each of the sense amps comprises a current amp in the form of 1 of more op amps or 2 or more inverters in its output signal path.

16. The multi-value processor according to claim 2, wherein each of the sense amps is gated by a clock.

17. The multi-value processor according to claim 2, wherein output signals from each of the sense amps is gated by a clock.

18. A multi-value processor, comprising:
an array of cells, each cell in the array of cells connected to a respective voltage signal result, the cells blocking the respective voltage signal result from being passed to an output;
a driver receiving a multi-value operand, the driver constructed to generate a set of driver signals responsive to a voltage level of the multi-value operand; and
wherein each cell is connected to at least one of the driver signals, and responsive to a state of the driver signal(s) one or more cells pass their respective voltage signal result to an output.

19. The multi-value processor according to claim 18 wherein the array is arranged in rows and columns, and the driver is a row driver for selecting a row of cells to have their respective voltage signal results output to a second stage column select area.

20. The multi-value processor according to claim 18 wherein the driver comprises a set of sense amps for generating the driver signals.

21. The multi-value processor according to claim 18, wherein some of the cells of the array further comprises a pair of pass-through transistors, each transistor having a pass state and a block state, the pair of transistors connected so that for the cells having a pair of pass-through transistors each of the cell's respective voltage signal result is passed only when both transistors of the pair of transistors are in the pass state, and each respective transistor of the pair of transistors sets its pass or block state responsive to a driver signal.

22. The multi-value processor according to claim 21, wherein the pair of pass-through transistors are both N-type transistors.

23. The multi-value processor according to claim 21, further comprising:
a second pair of pass-through transistors that act in parallel to the pair of pass-through transistors, the second pair of pass-through transistors selected (1) to react faster than the pair of pass-through transistors at some voltage levels and (2), to react slower than the pair of pass-through transistors at other voltage levels; and
wherein the pair of pass-through transistors and second pair of pass-through transistors are arranged such that the voltage signal result is first passed through the faster reacting pair of pass-through transistors.

24. The multi-value processor according to claim 23, wherein one pair of pass-transistors uses two N-type transistors and the other pair of pass-through transistors uses two P-type transistors.

* * * * *